United States Patent
Chan et al.

(10) Patent No.: US 10,014,307 B2
(45) Date of Patent: Jul. 3, 2018

(54) SEMICONDUCTOR DEVICE MANUFACTURING METHOD INCLUDING IMPLEMENTING ELEMENTS OF MEMORY UNIT AND LOGIC UNIT

(71) Applicant: Semiconductor Manufacturing International (Shanghai) Corporation, Shanghai (CN)

(72) Inventors: YiPeng Chan, Shanghai (CN); Jieqiong Dong, Shanghai (CN); Huajun Jin, Shanghai (CN); Ruling Zhou, Shanghai (CN); Shibi Guo, Shanghai (CN); Bongkil Kim, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/961,525

(22) Filed: Dec. 7, 2015

(65) Prior Publication Data

US 2016/0190148 A1    Jun. 30, 2016

(30) Foreign Application Priority Data

Dec. 25, 2014   (CN) .......................... 2014 1 0843455

(51) Int. Cl.
*H01L 27/15*    (2006.01)
*H01L 27/11521*    (2017.01)
(Continued)

(52) U.S. Cl.
CPC .. *H01L 27/11521* (2013.01); *H01L 21/28273* (2013.01); *H01L 27/11524* (2013.01);
(Continued)

(58) Field of Classification Search
CPC ......... H01L 27/11536; H01L 27/11539; H01L 27/11541; H01L 27/11543;
(Continued)

(56) References Cited

U.S. PATENT DOCUMENTS 5,911,105 A * 6/1999 Sasaki ................... H01L 27/105
257/E21.689
6,074,914 A * 6/2000 Ogura ............... H01L 21/28273
257/E21.209
(Continued)

*Primary Examiner* — Scott B Geyer
(74) *Attorney, Agent, or Firm* — Innovation Counsel LLP

(57) ABSTRACT

A method for manufacturing a semiconductor device includes providing a substrate, a first conductor, a second conductor, a first dielectric, a second dielectric, and a designated region. The first conductor is positioned between the first dielectric and the substrate. The second conductor is positioned between the second dielectric and the substrate. The first designated region is positioned in the substrate. The method includes providing a conductive material layer, which completely covers the first dielectric and the second dielectric. The method includes partially removing the conductive material layer to form a third conductor and a fourth conductor. The first dielectric is positioned between the third conductor and the first conductor. The fourth conductor directly contacts the designated region. The method includes implementing a memory unit using the first conductor and the third conductor and includes implementing a logic unit using the second conductor and the designated region.

15 Claims, 6 Drawing Sheets

(51) Int. Cl.
| | | |
|---|---|---|
| *H01L 29/66* | (2006.01) | |
| *H01L 21/28* | (2006.01) | |
| *H01L 29/423* | (2006.01) | |
| *H01L 29/788* | (2006.01) | |
| *H01L 27/11524* | (2017.01) | |
| *H01L 27/11536* | (2017.01) | |
| *H01L 27/11539* | (2017.01) | |
| *H01L 27/11541* | (2017.01) | |
| *H01L 27/11543* | (2017.01) | |

(52) U.S. Cl.
CPC .. *H01L 27/11536* (2013.01); *H01L 27/11539* (2013.01); *H01L 27/11541* (2013.01); *H01L 27/11543* (2013.01); *H01L 29/42324* (2013.01); *H01L 29/66545* (2013.01); *H01L 29/66825* (2013.01); *H01L 29/7881* (2013.01)

(58) Field of Classification Search
CPC ......... H01L 27/11521; H01L 21/28273; H01L 29/42324; H01L 29/66545; H01L 29/66825; H01L 29/7881; H01L 27/11517; H01L 29/42328
See application file for complete search history.

(56) References Cited

U.S. PATENT DOCUMENTS

| | | | | |
|---|---|---|---|---|
| 7,045,413 | B2 * | 5/2006 | Lee | ................... H01L 21/28273 257/E21.686 |
| 9,112,056 | B1 * | 8/2015 | Shroff | ............... H01L 21/28273 |
| 9,257,304 | B2 * | 2/2016 | Chang | ............... H01L 21/32139 |
| 2013/0313625 | A1 * | 11/2013 | Kao | ................... H01L 21/28273 257/319 |
| 2015/0054051 | A1 * | 2/2015 | Wang | .................... H01L 29/788 257/316 |
| 2015/0137207 | A1 * | 5/2015 | Chuang | .................. H01L 29/49 257/316 |
| 2015/0311298 | A1 * | 10/2015 | Han | ...................... H01L 29/788 257/316 |
| 2016/0064394 | A1 * | 3/2016 | Chu | .................... H01L 29/7883 257/321 |

\* cited by examiner

US 10,014,307 B2

SEMICONDUCTOR DEVICE MANUFACTURING METHOD INCLUDING IMPLEMENTING ELEMENTS OF MEMORY UNIT AND LOGIC UNIT

CROSS-REFERENCE TO RELATED APPLICATION

This application claims priority to and benefit of Chinese Patent Application No. 201410843455.X, filed on 25 Dec. 2014; the Chinese Patent Application is incorporated herein by reference to its entirety.

BACKGROUND

The technical field is related to semiconductor device, a method for manufacturing the semiconductor device, and an electronic device that includes the semiconductor device. The semiconductor device may include or may be a memory device.

A memory device may include a logic unit and a memory unit. The logic unit and the memory unit may have different gate structures. For manufacturing the memory device, several etching processes involving several masks may be performed. The etching processes and/or the masks may be complicated and may undesirably add to time and cost associated with the manufacturing of the memory device.

SUMMARY

An embodiment may be related to a method for manufacturing a semiconductor device. The method may include providing a substrate (e.g., a semiconductor substrate), a first conductor, a second conductor, a first dielectric, a second dielectric, and a first designated region. The first conductor may directly contact the first dielectric and may be positioned between the first dielectric and the substrate. The second conductor may directly contact the second dielectric and may be positioned between the second dielectric and the substrate. The first designated region may be positioned in the substrate.

The method may include providing a conductive material layer, which may completely cover the first dielectric and the second dielectric. The method may include partially removing the conductive material layer to form remaining portions of the conductive material layer, which may include a third conductor and a fourth conductor. The first dielectric may be positioned between the third conductor and the first conductor. The fourth conductor may directly contact the first designated region;

The method may include implementing a floating gate electrode of a memory unit using the first conductor. The method may include implementing a control gate electrode of the memory unit using the third conductor. The method may include implementing a gate electrode of a first logic unit using the second conductor. The method may include implementing a source region or a drain region of the first logic unit using the first designated region.

The method may include providing a dielectric material member on a conductive material member. The method may include partially removing the dielectric material and the conductive material member in a same process to form the first dielectric, the second dielectric, the first conductor, and the second conductor.

The method may include forming the first dielectric and the second dielectric on a conductive material member. The method may include using the first dielectric and the second dielectric as mask members to protect portions of the conductive material member when partially removing the conductive material member to form the first conductor and the second conductor.

The method may include removing the second dielectric after the third conductor and the fourth conductor have been formed.

The method may include using the third conductor and the fourth conductor as parts of a mask in a process of removing the second dielectric. The method may include removing the second dielectric through a space between the third conductor and the fourth conductor.

The second dielectric may be exposed after the partially removing the conductive material layer. The first dielectric may remain completely covered after the partially removing the conductive material layer.

The first conductor may be positioned between the first dielectric and a first doped well of the substrate. The second conductor may be positioned between the second dielectric and the first doped well of the substrate.

The method may include providing a first spacer, which may directly contact the second conductor and may be positioned between the second conductor and the first conductor. The third conductor may directly contact the first spacer.

The method may include using the third conductor to protect the first spacer when removing the second dielectric.

The method may include providing a second spacer, which may directly contact each of the first conductor and the first dielectric. The third conductor may directly contact the second spacer.

A portion of the third conductor may be positioned between a portion of the first spacer and a portion of the second spacer in a direction parallel to a bottom side of the substrate. The first spacer may directly contact the second spacer.

The method may include providing a first spacer, which may directly contact each of the first conductor and the first dielectric and may be positioned between the second conductor and the first conductor. The third conductor may directly contact each of the first spacer and the first dielectric.

The method may include providing a fifth conductor and a third dielectric layer. The fifth conductor may directly contact the third dielectric layer and may be positioned between the third dielectric layer and the substrate. The method may include providing a second designated region, which may be positioned in the substrate. The method may include providing an insulator, which may be positioned between the first designated region and the second designated region. The method may include implementing a gate electrode of a second logic unit using the fifth conductor. The method may include implementing a source region or a drain region of the second logic unit using the second designated region. The fourth conductor may directly contact each of the first designated region and the second designated region.

The method may include providing a first spacer, which may directly contact the second conductor. The method may include providing a second spacer, which directly contact the fifth conductor. The fourth conductor may directly contact each of the first spacer and the second spacer. The method may include using the fourth conductor to protect the first spacer and the second spacer when removing the second dielectric and the third dielectric.

An embodiment may be related to a semiconductor device. The semiconductor device may include a memory unit, a first logic unit, a second logic unit, and a conductive interconnect. The memory unit may include a control gate electrode, a floating gate electrode, and a dielectric positioned between the control gate electrode and the floating gate electrode. The control gate electrode may be formed of a first conductive material. The conductive interconnect may directly contact a drain region of the first logic unit or a source region of the first logic unit, may directly contact a drain region of the second logic unit or a source region of the second logic unit, and may be formed of the first conductive material.

A (minimum) thickness of the control gate electrode in a direction perpendicular to the control gate electrode may be substantially equal to a (minimum) thickness of the conductive interconnect in a direction perpendicular to the conductive interconnect.

The semiconductor may include a substrate, which may overlap elements of each of the memory unit, the first logic unit, the second logic unit, and the conductive interconnect. A side of the dielectric may directly contact the floating gate electrode. A first side of a gate electrode of the first logic unit may be positioned between the substrate and a second side of the gate electrode of the first logic unit. A minimum distance between the substrate and the second side of the gate electrode of the first logic unit may be substantially equal to a minimum distance between the substrate and the side of the dielectric.

The semiconductor device may include a third logic unit and a spacer. The spacer may directly contact a gate electrode of the third logic unit and may directly contact the control gate electrode of the memory unit.

An embodiment may be related to an electronic device. The electronic device may include an electronic component and a semiconductor device electrically connected to the electronic component. The semiconductor device may have one or more of the aforementioned features.

According to embodiments, in manufacturing of a semiconductor device, a mask member may be retained as a dielectric member in a gate structure, and/or one or more interconnect members and a control gate member may be formed using a same conductive material layer. Therefore, etching processes and/or masks required in the manufacturing of the semiconductor device may be substantially minimized. Advantageously, time and/or cost associated with the manufacturing of the semiconductor device may be substantially minimized.

The above summary is related to some of many embodiments disclosed herein and is not intended to limit the scope of embodiments.

DETAILED DESCRIPTION

Figure 1:
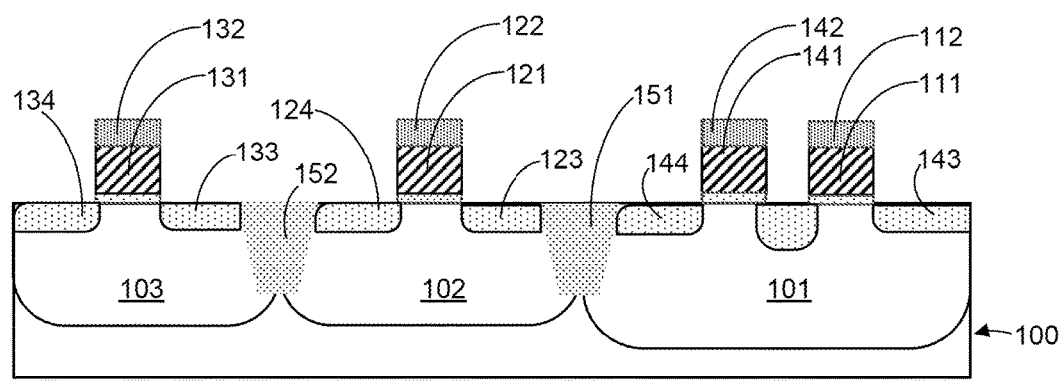
FIG. 1, FIG. 2, FIG. 3, FIG. 4, FIG. 5, and FIG. 6 show schematic diagrams (e.g., schematic cross-sectional views) that illustrate elements and/or structures formed in a method for manufacturing a semiconductor device in accordance with one or more embodiments.

Example embodiments are described with reference to the accompanying drawings. As those skilled in the art would realize, the described embodiments may be modified in various different ways, all without departing from the spirit or scope. Embodiments may be practiced without some or all of these specific details. Well known process steps and/or structures may not have been described in detail in order to not unnecessarily obscure described embodiments.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting possible embodiments. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements should not be limited by these terms. These terms may be used to distinguish one element from another element. Thus, a first element discussed below may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may be provided between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the embodiments. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive". The term "electrically connected" may mean "electrically connected without any intervening transistors".

The term "conductor" may mean "electrically conductive member". The term "insulator" may mean "electrically insulating member". The term "dielectric" may mean "dielectric member". The term "interconnect" may mean "interconnecting member". The term "provide" may mean "provide and/or form". The term "form" may mean "provide and/or form".

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, embodiments may also cover apparatuses for practicing embodiments. Such apparatus may include circuits, dedicated and/or programmable, to carry out operations pertaining to embodiments. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments.

Figure 5:
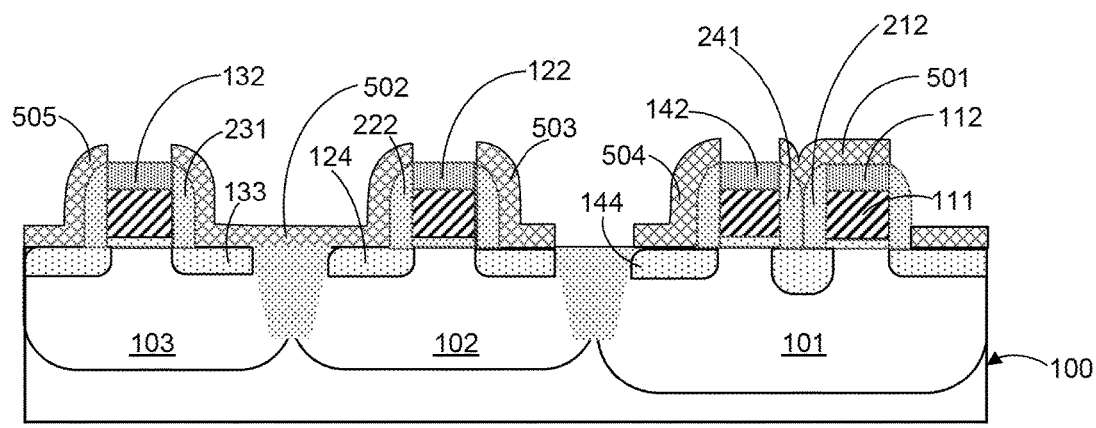
Figure 6:
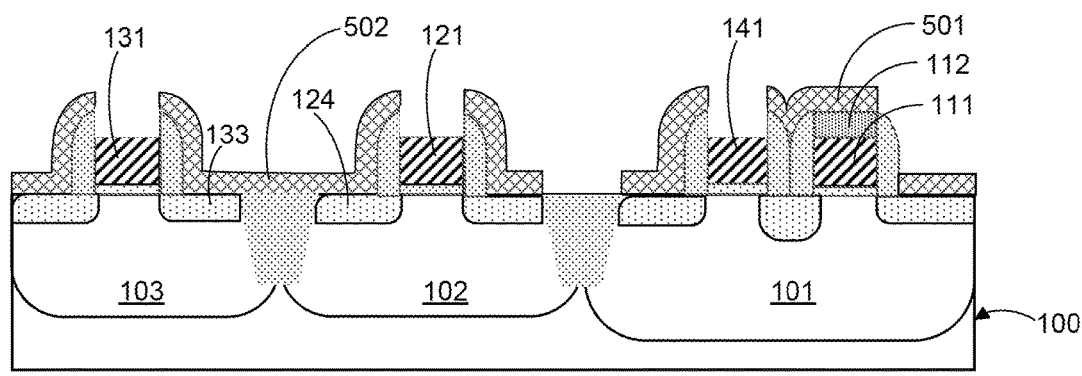
Figure 7:
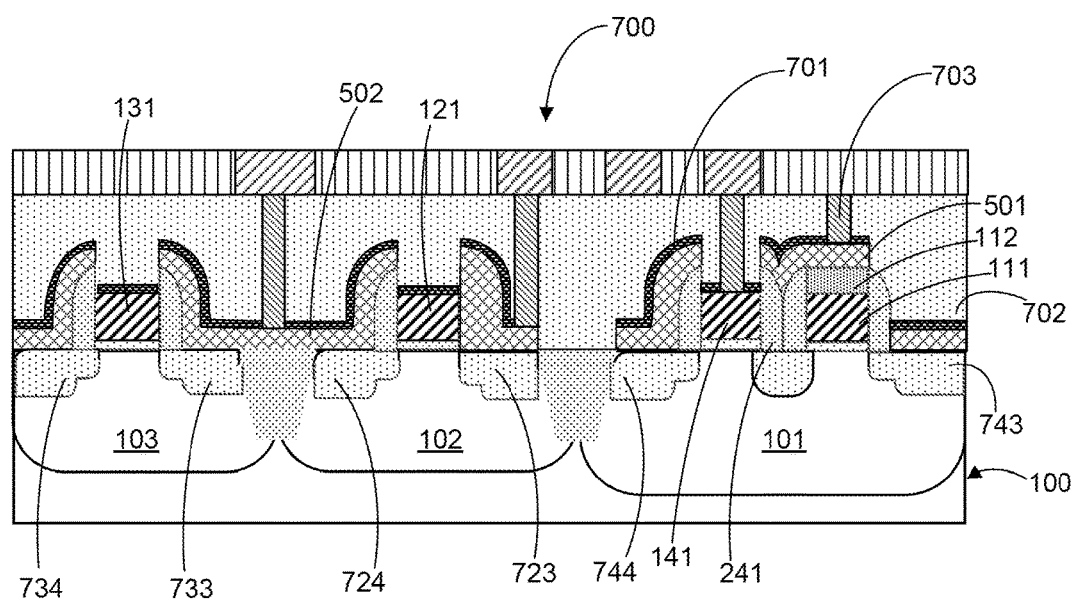
FIG. 7 shows a schematic diagram (e.g., a schematic cross-sectional view) that illustrates elements and/or structures in a semiconductor device in accordance with one or more embodiments.
Figure 8:
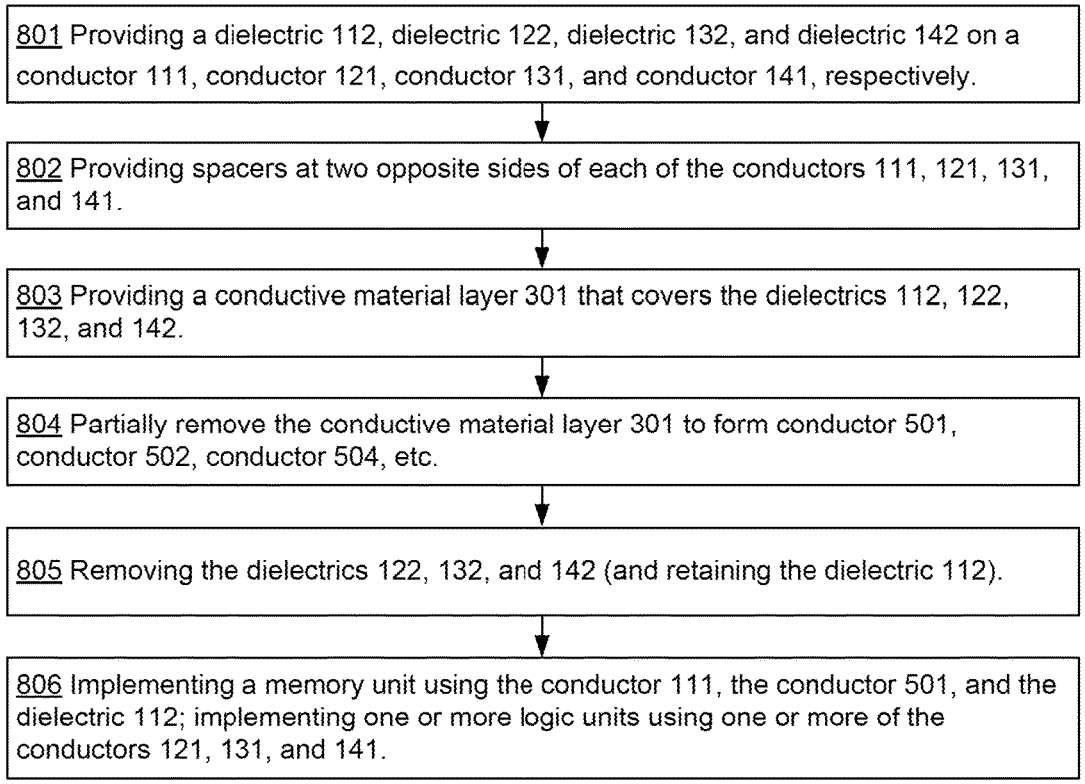
FIG. 8 shows a flowchart that illustrates steps in a method for manufacturing a semiconductor device in accordance with one or more embodiments of the present invention.

FIG. 1, FIG. 2, FIG. 3, FIG. 4, FIG. 5, FIG. 6, and FIG. 7 show schematic diagrams (e.g., schematic cross-sectional views) that illustrate elements and/or structures formed in a method for manufacturing a semiconductor device 700 in accordance with one or more embodiments. FIG. 7 shows a schematic diagram (e.g., a schematic cross-sectional view) that illustrates elements and/or structures in the semiconductor device 700 in accordance with one or more embodiments. FIG. 8 shows a flowchart that illustrates steps in a method for manufacturing the semiconductor 700 device in accordance with one or more embodiments of the present invention.

Referring to FIG. 8, the method may include steps 801, 802, 803, 804, 805, and 806.

Referring to FIG. 8 and FIG. 1, the step 801 may include the following sub-steps: providing a substrate 100; and providing a dielectric 112, dielectric 122, dielectric 132, and dielectric 142 on a conductor 111, conductor 121, conductor 131, and conductor 141, respectively.

The substrate 100 may be a semiconductor substrate. The substrate 100 may be a monocrystalline silicon substrate, a polycrystalline silicon substrate, or a silicon-on-insulator (SOI) substrate. The substrate 100 may include a doped well 101, a doped well 102, and a doped well 103. Each of the doped wells 101, 102, and 103 may be an n-well or a p-well. The substrate 100 may include a designated region 123, a designated region 124, a designated region 133, a designated region 134, a designated region 143, and a designated region 144. The substrate 100 may include an insulator 151 (or dielectric 151) and an insulator 152 (or dielectric 152). The insulators 151 and 152 may be shallow trench isolation (STI) members. The insulator 151 may be positioned between designated regions 123 and 144 and may be positioned between doped wells 102 and 101. The insulator 152 may be positioned between designated regions 133 and 124 and may be positioned between doped wells 103 and 102.

The conductor 111 may directly contact the dielectric 112 and may be positioned between the dielectric 112 and doped well 101. The conductor 121 may directly contact the dielectric 122 and may be positioned between the dielectric 122 and doped well 102. The conductor 131 may directly contact the dielectric 132 and may be positioned between the dielectric 132 and doped well 103. The conductor 141 may directly contact the dielectric 142 and may be positioned between the dielectric 142 and doped well 101.

The conductors 111, 121, 131, and 141 may be formed of a same material. Each of conductors 111, 121, 131, and 141 may be formed of at least one of a polysilicon material, a metal material, etc.

The dielectrics 112, 122, 132, and 142 may be formed of a same material. Each of the dielectrics 112, 122, 132, and 142 may be formed of silicon nitride and/or silicon oxide; may have a composite structure that includes a silicon oxide layer and a silicon nitride layer; or may have a composite structure that includes a silicon oxide layer, a silicon nitride layer, and a silicon oxide layer.

The method may include the following steps: providing a conductive member on the substrate 100; providing a dielectric material member on the conductive material member; and partially removing the dielectric material and the conductive material member in a same process (e.g., an etching process) to form the dielectrics 112, 122, 132, and 142 and the conductors 111, 121, 131, and 141.

The method may include the following steps: providing a conductive material member on the substrate 100; providing a dielectric material member on the conductive material member; partially removing the dielectric material member to form the dielectrics 112, 122, 132, and 142 on the conductive material member; using the dielectrics 112, 122, 132, and 142 as mask members to protect portions of the conductive material member when partially removing the conductive material member to form the conductors 111, 121, 131, and 141.

Figure 2:
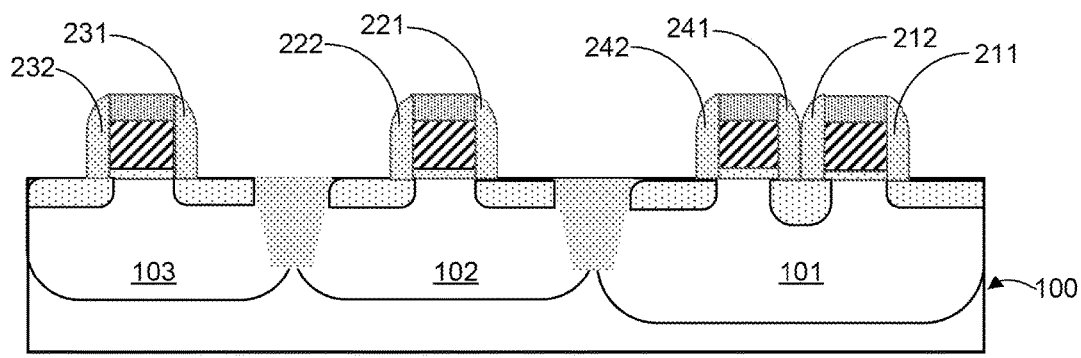

Referring to FIG. 8, FIG. 1, and FIG. 2, subsequent to the step 801, the step 802 may include providing spacers at two opposite sides of each of the conductors 111, 121, 131, and 141. The spacers may include spacers 211, 212, 221, 222, 231, 232, 241, and 242. Two spacers may respectively and directly contact two opposite sides of an associated conductor and two opposite sides of an associated dielectric. For example, the spacers 211 and 212 may respectively and directly contact two opposite sides of the conductor 111 and two opposite sides of the dielectric 112. Other spacers, conductors, and dielectrics may have analogous structures. The spacers 212 and 241 may be positioned between the conductors 111 and 121 and may directly contact each other.

The spacers 211, 212, 221, 222, 231, 232, 241, and 242 may be formed of a same material. Each of the spacers 211, 212, 221, 222, 231, 232, 241, and 242 may be formed of silicon nitride and/or silicon oxide; may have a composite structure that includes a silicon oxide layer and a silicon nitride layer; or may have a composite structure that includes a silicon oxide layer, a silicon nitride layer, and a silicon oxide layer.

Figure 3:
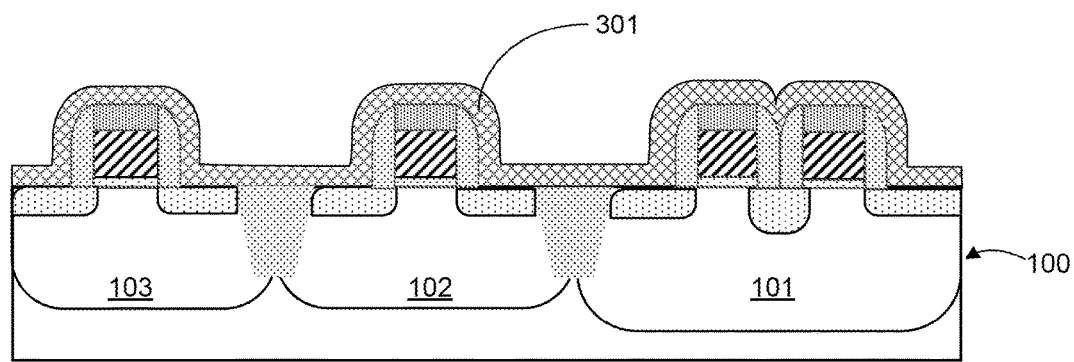
Figure 4:
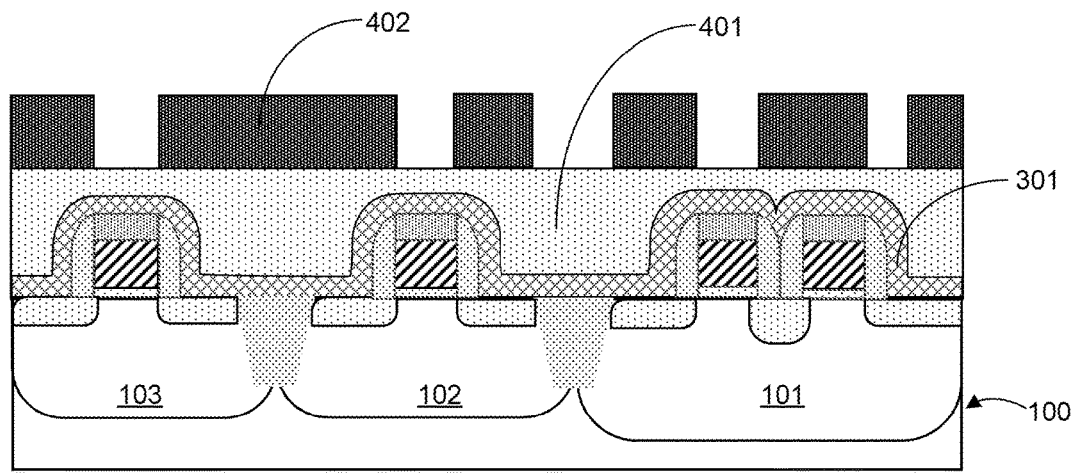

Referring to FIG. 8, FIG. 2, and FIG. 3, subsequent to the step 802, the step 803 may include providing a conductive material layer 301 that completely covers the dielectrics 112, 122, 132, and 142. The conductive material layer 301 may completely cover the spacers 211, 212, 221, 222, 231, 232, 241, and 242. The conducive material layer 301 may cover exposed portions of the substrate 100. The conductive material layer 301 may be formed of at least one of a polycrystalline silicon material, a metal material, etc. The conductive material layer 301 may be formed through deposition and/or one or more other suitable processes.

Referring to FIG. 8, FIG. 3, FIG. 4, and FIG. 5, subsequent to the step 803, the step 804 may include partially removing the conductive material layer 301 to form remaining portions of the conductive material layer, which may include conductors 501, 502, 503, 504, and 505.

The dielectric 112 may be positioned between the conductor 501 and the conductor 111. The conductor 501 may directly contact each of the dielectric 112, the spacer 212, and the spacer 241. A portion of the conductor 501 may be positioned between a portion (e.g., top portion) of the spacer 241 and a portion (e.g., top portion) of the spacer 212 in a direction parallel to a bottom side of the substrate 100. The spacer 241 may directly contact the spacer 212.

The conductor 504 may directly contact the designated region 144. The conductor 504 may directly contact the spacer 242. The dielectric 142 may be exposed through a space between the conductor 501 and the conductor 504.

The conductor 502 may directly contact each of the designated region 133 and the designated region 124. The conductor 502 may directly contact each of the spacer 231 and the spacer 222.

The step 804 may include the following sub-steps: providing a mask 401 (e.g., a hard mask) on the conductive material layer 301; providing a mask 402 on the mask 401; and etching the conductive material layer 301 through the mask 402 and the mask 401 to form the conductors 501, 502, 503, 504, and 505. The mask 401 may include a bottom anti-reflective coating (BARC) layer and a low temperature oxide (LTO) layer. The BARC layer may be positioned between the conductive material layer 301 and the LTO layer. The LTO layer may be a silicon oxide layer.

After the step 804, the dielectrics 122, 132, and 142 may be exposed, and the dielectric 112 may remain completely covered.

Referring to FIG. 8, FIG. 5, and FIG. 6, subsequent to the step 804, the step 805 may include removing the dielectrics 122, 132, and 142. The dielectric 112 may be retained.

The dielectrics 122, 132, and 142 may be removed through an etching process and/or one or more other suitable processes. The step 804 may include using the conductors 503, 502, 505, 501, and 504 as parts of a mask in the process of removing the dielectrics 122, 132, and 142. The step 804 may include removing the dielectrics 122, 132, and 142 through spaces between the conductors 503, 502, 505, 501, and 504. The conductors 503, 502, 505, 501, and 504 may protect one or more of the spacers during the step 805. The conductor 501 may protect the dielectric 112, the spacer 212, and/or the spacer 241 during the step 805.

Referring to FIG. 8, FIG. 6, and FIG. 7, subsequent to the step 805, the step 806 may include the sub-steps: implementing a memory unit using the conductor 111, the conductor 501, and the dielectric 112, and implementing logic units, e.g., transistors, using the conductors 121, 131, and 141 (and using the designated regions 123, 124, 133, 134, 143 and 144).

The method may include implementing a floating gate electrode of a memory unit using the conductor 111. The method may include implementing a control gate electrode of the memory unit using the conductor 501. The dielectric 112 may insulate the floating gate electrode 111 from the control gate electrode 501.

The method may include implementing a gate electrode of a logic unit, e.g., a select transistor, using the conductor 141. The method may include implementing a source region or a drain region of the logic unit using the designated region 143 or 144.

The method may include implementing a gate electrode of a logic unit, e.g., a p-channel metal-oxide-semiconductor field-effect (PMOS) transistor or an n-channel metal-oxide-semiconductor field-effect (NMOS) transistor using each of the conductor 121 and the conductor 131. The method may include implementing a source region or a drain region of a corresponding logic unit using each of the designated region 123, the designated region 124, the designated region 133, and the designated region 134.

Ion implantation may be performed on the designated regions 123, 124, 133, 134, 143 and 144 for forming the source/drain region(s) 723, 724, 733, 734, 743 and 744. The conductor 502 may function as a conductive interconnect that electrically connects regions 724 and 733.

The step 806 may include the sub-steps: providing a metal silicide layer 701 on the conductors 501, 502, 503, 504, and 505; providing a dielectric layer 702 on the metal silicide layer 701; forming contact holes through the dielectric layer 702; and providing conductive members, e.g., a conductive member 703, in the contact holes for provide electrical connections to the conductors 501, 121, 502, etc.

The semiconductor device 700 may include a memory unit, a first logic unit, a second logic unit, and a conductive interconnect 502. The semiconductor device 700 may include or may be a programmable memory device, such as a multiple-time programmable memory device.

The memory unit may include a control gate electrode 501, a floating gate electrode 111, and a dielectric 112 positioned between the control gate electrode 501 and the floating gate electrode 111. The control gate electrode 501 may be formed of a first conductive material, e.g., a polycrystalline silicon material and/or a metal material.

The first logic unit may be a PMOS transistor or an NMOS transistor. The first logic unit may include a gate electrode 121, a source/drain region 723, and a source/drain region 724.

The second logic unit may be a PMOS transistor or an NMOS transistor. The second logic unit may include a gate electrode 131, a source/drain region 733, and a source/drain region 734.

The conductive interconnect 502 may be formed of the first conductive material. The conductive interconnect 502 may directly contact the source/drain region 724 of the first logic unit and may directly contact the source/drain region 733 of the second logic unit.

Since the control gate electrode 501 and the conductive interconnect 502 represent two remaining portions of the same conductive material layer, a (minimum) thickness of the control gate electrode 501 in a direction perpendicular to the control gate electrode 501 may be substantially equal to a (minimum) thickness of the conductive interconnect 502 in a direction perpendicular to the conductive interconnect 502.

The substrate 100 may overlap elements of each of the memory unit, the first logic unit, the second logic unit, and the conductive interconnect 502. A side of the dielectric 112 may directly contact a side of the floating gate electrode 111. A first side of a gate electrode 121 of the first logic unit may be positioned between the substrate and a second side 121 of the gate electrode of the first logic unit. A minimum distance between the substrate 100 and the second side of the gate electrode 121 of the first logic unit may be substantially equal to a minimum distance between the substrate 100 and the side of the dielectric 112. A minimum distance between the substrate 100 and the second side of the gate electrode 121 may be substantially equal to a minimum distance between the substrate 100 and the side of the floating gate electrode 111.

The semiconductor device 700 may include a third logic unit and a spacer 241. The third logic unit may include a gate electrode 141 and a source drain region 144. The spacer 241 may directly contact a gate electrode 141 of the third logic unit and may directly contact the control gate electrode 501 of the memory unit.

Figure 9:
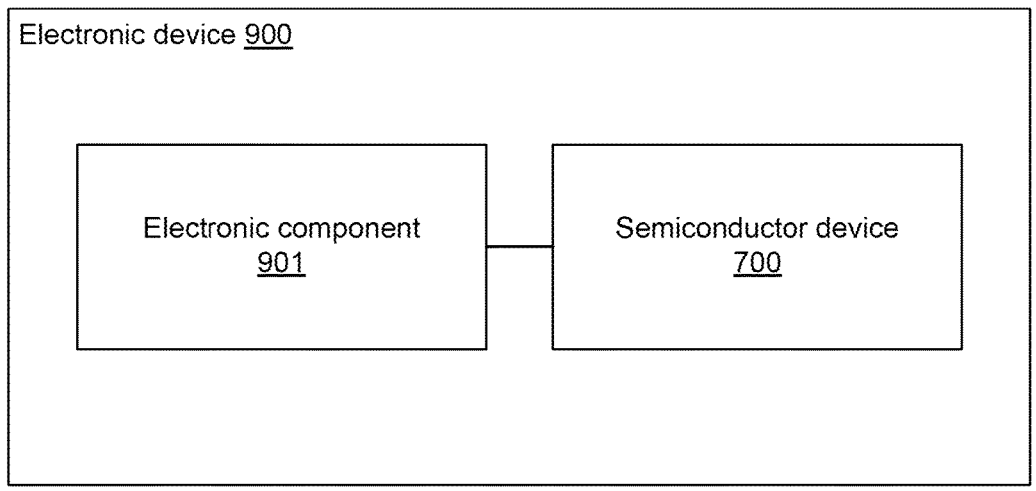
FIG. 9 shows a schematic block diagram that illustrates elements in an electronic device in accordance with one or more embodiments of the present invention.

FIG. 9 shows a schematic block diagram that illustrates elements in an electronic device 900 in accordance with one or more embodiments of the present invention. The electronic device 900 may include an electronic component 901 and a semiconductor device 700 that is electrically connected to the electronic component 901. The semiconductor device 700 may have one or more of the above-discussed features.

In an embodiment, the electronic device 900 may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment the electronic device 900 may be or may include an intermediate product (e.g., a mobile phone main board) or module including a semiconductor device that may have one or more of the features and advantages discussed above.

According to embodiments, in manufacturing of a semiconductor device, a mask member may be retained as a dielectric member in a gate structure (e.g., in a memory unit), and/or one or more interconnect members (e.g., between logic units) and a control gate member (e.g. in a memory unit) may be formed using a same conductive material layer. Therefore, etching processes and/or masks required in the manufacturing of the semiconductor device may be substantially minimized. Advantageously, time and/or cost associated with the manufacturing of the semiconductor device may be substantially minimized.

While some embodiments have been described as examples, there are alterations, permutations, and equivalents. It should also be noted that there are many alternative ways of implementing the methods and apparatuses. Furthermore, embodiments may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents.

What is claimed is:

1. A method for manufacturing a semiconductor device, the method comprising:
   providing a substrate, a first conductor, a second conductor, a first dielectric, a second dielectric, and a first designated region, wherein the first conductor is positioned between the first dielectric and the substrate, wherein the second conductor is positioned between the second dielectric and the substrate, and wherein the first designated region is positioned in the substrate;
   providing a conductive material layer, which covers the first dielectric and the second dielectric;
   partially removing the conductive material layer to form remaining portions of the conductive material layer, which include a third conductor and a fourth conductor, wherein the first dielectric is positioned between the third conductor and the first conductor, and wherein the fourth conductor directly contacts the first designated region;
   implementing a floating gate electrode of a memory unit using the first conductor;
   implementing a control gate electrode of the memory unit using the third conductor;
   implementing a gate electrode of a first logic unit using the second conductor; and
   implementing a source region or a drain region of the first logic unit using the first designated region.

2. The method of claim 1, comprising:
   providing a dielectric material member on a conductive material member; and
   partially removing the dielectric material and the conductive material member to form the first dielectric, the second dielectric, the first conductor, and the second conductor.

3. The method of claim 1, comprising:
   removing the second dielectric after both the third conductor and the fourth conductor have been formed.

4. The method of claim 1, comprising:
   using the third conductor and the fourth conductor as parts of a mask in a process of removing the second dielectric; and
   removing the second dielectric through a space between the third conductor and the fourth conductor.

5. The method of claim 1,
   wherein the second dielectric is exposed after the partially removing the conductive material layer, and
   wherein the first dielectric remains covered after the partially removing the conductive material layer.

6. The method of claim 1,
   wherein the first conductor is positioned between the first dielectric and a first doped well of the substrate, and wherein the second conductor is positioned between the second dielectric and the first doped well of the substrate.

7. The method of claim 1, comprising:
providing a first spacer, which directly contacts the second conductor and is positioned between the second conductor and the first conductor,
wherein the third conductor directly contacts the first spacer.

8. The method of claim 7, comprising:
using the third conductor to protect the first spacer when removing the second dielectric.

9. The method of claim 7, comprising:
providing a second spacer, which directly contacts each of the first conductor and the first dielectric,
wherein the third conductor directly contacts the second spacer.

10. The method of claim 9, wherein a portion of the third conductor is positioned between a portion of the first spacer and a portion of the second spacer in a direction parallel to a bottom side of the substrate.

11. The method of claim 9, wherein the first spacer directly contacts the second spacer.

12. The method of claim 1, comprising:
providing a first spacer, which directly contacts each of the first conductor and the first dielectric and is positioned between the second conductor and the first conductor,
wherein the third conductor directly contacts each of the first spacer and the first dielectric.

13. The method of claim 1, comprising:
providing a fifth conductor and a third dielectric layer, wherein the fifth conductor is positioned between the third dielectric layer and the substrate;
providing a second designated region, which is positioned in the substrate;
providing an insulator, which is positioned between the first designated region and the second designated region;
implementing a gate electrode of a second logic unit using the fifth conductor; and
implementing a source region or a drain region of the second logic unit using the second designated region,
wherein the fourth conductor directly contacts each of the first designated region and the second designated region.

14. The method of claim 13, comprising:
providing a first spacer, which directly contacts the second conductor; and
providing a second spacer, which directly contact the fifth conductor,
wherein the fourth conductor directly contacts each of the first spacer and the second spacer.

15. The method of claim 14, comprising:
using the fourth conductor to protect the first spacer and the second spacer when removing the second dielectric and the third dielectric.

* * * * *